United States Patent
Shimazaki et al.

(10) Patent No.: US 6,671,219 B1
(45) Date of Patent: Dec. 30, 2003

(54) STORAGE, STORAGE METHOD, AND DATA PROCESSING SYSTEM

(75) Inventors: Yasuhisa Shimazaki, Kodaira (JP); Tsuyoshi Koike, Akishima (JP); Makoto Mizoguchi, Akishima (JP)

(73) Assignees: Hitachi, Ltd., Tokyo (JP); Hitachi ULSI Systems Co., Ltd., Tokyo (JP)

(*) Notice: Subject to any disclaimer, the term of this patent is extended or adjusted under 35 U.S.C. 154(b) by 0 days.

(21) Appl. No.: 09/979,951

(22) PCT Filed: May 28, 1999

(86) PCT No.: PCT/JP99/02841
§ 371 (c)(1),
(2), (4) Date: Nov. 27, 2001

(87) PCT Pub. No.: WO00/74058
PCT Pub. Date: Dec. 7, 2000

(51) Int. Cl.[7] .................................................. G11C 8/00
(52) U.S. Cl. ................. 365/230.06; 712/300; 711/105; 711/201
(58) Field of Search ....................... 365/230.06, 230.08, 365/238.5; 712/300; 711/105, 201, 118, 203

(56) References Cited

U.S. PATENT DOCUMENTS

| | | | | |
|---|---|---|---|---|
| 4,833,657 A | * | 5/1989 | Tanaka ................... 365/230.04 |
| 4,845,664 A | * | 7/1989 | Aichelmann et al. ....... 711/105 |
| 5,185,872 A | * | 2/1993 | Arnold et al. .............. 712/217 |
| 5,307,321 A | * | 4/1994 | Sasai et al. ............ 365/230.03 |
| 5,398,328 A | * | 3/1995 | Weber et al. ................ 717/143 |
| 5,408,632 A | * | 4/1995 | Mori ...................... 365/230.06 |
| 5,477,543 A | * | 12/1995 | Purcell ....................... 370/537 |
| 5,943,283 A | * | 8/1999 | Wong et al. ........... 365/230.01 |

FOREIGN PATENT DOCUMENTS

| | | |
|---|---|---|
| JP | 63-142592 | 6/1988 |
| JP | 63-142593 | 6/1988 |
| JP | 2-89279 | 3/1990 |
| JP | 2-181244 | 7/1990 |
| JP | 2-292647 | 12/1990 |
| JP | 5-181744 | 7/1993 |
| JP | 6-332793 | 12/1994 |
| JP | 9-231130 | 9/1997 |
| JP | 10-228766 | 8/1998 |

OTHER PUBLICATIONS

1999 IEEE International Solid–State Circuits Conference, pp. 190–201, 459–461.

* cited by examiner

*Primary Examiner*—Hong Kim
(74) *Attorney, Agent, or Firm*—Mattingly, Stanger & Malur, P.C.

(57) ABSTRACT

In a storage device from which n bits of data are read at a time, data pieces whose logical bit positions are $0*8+k$, $1*8+k$, $2*8+k$, $3*8+k$, ..., $m*8+k$ (where k and m are natural numbers satisfying $0 \leq k \leq 7$, $0 \leq m \leq n/8-1$) are stored in memory cells close to one another in a memory cell array, and the bit positions are shifted by a predetermined number of bits when data having a small number of significant bits is read from the memory cell array.

14 Claims, 14 Drawing Sheets

(a)

k AND m ARE NATURAL NUMBERS.
$0 \leq k \leq 7$
$0 \leq m \leq n/8-1$
N : BASIC DATA SIZE (b)

(c)

(a) WHEN LOW-ORDER 16 BITS ARE READ:

(b) WHEN HIGH-ORDER 16 BITS ARE READ:

(a) WHEN 8 BITS (BYTE 0) ARE READ:

(b) WHEN 8 BITS (BYTE 1) ARE READ:

(c) WHEN 8 BITS (BYTE 2) ARE READ:

(d) WHEN 8 BITS (BYTE 3) ARE READ:

(a)

(b)

STORAGE, STORAGE METHOD, AND DATA PROCESSING SYSTEM

TECHNICAL FIELD

The present invention relates to a binary data storage device. More particularly, the present invention relates to a technology that may be applied conveniently to a semiconductor storage device, such as a RAM (Random Access Memory) and a ROM (Read Only Memory), which is connected to a data processor such as a microprocessor or a microcomputer and to or from which data is written or read one byte (8 bits), one word (16 bits), and an integral multiple of 8 bits at a time.

BACKGROUND ART

As the operation frequency or the data processing power (number of data bits) of a microprocessor or a microcomputer that accesses a semiconductor storage device increases, there is a need for a higher-speed semiconductor storage device.

To satisfy this need, various technologies have been proposed to increase the speed of a semiconductor storage device. Examples of those technologies are found in JP-A-6-332793 or in IEEE International Solid-State Circuits Conference DIGEST OF TECHNICAL PAPERS, PP. 190–201, 1999. However, the conventional technique to increase the speed of a semiconductor storage device has placed emphasis on device miniaturization or on the increase in speed of a memory cell circuit from which data is read. Those technologies do not take into consideration the relation with a data processor, such as a microprocessor or a microcomputer, to which the semiconductor storage device is connected.

Normally, the configuration of a semiconductor storage device is such that the read/write operation can be performed at a time for the number of data bits basically used by a data processor, such as a microprocessor or a microcomputer, connected to the semiconductor storage device. For example, a semiconductor storage device connected to a data processor whose basic data length is 32 bits is configured such that data is read or written efficiently 32 bits at a time. Similarly, a semiconductor storage device connected to a data processor whose basic data length is 64 bits is configured such that data is read or written efficiently 64 bits at a time.

Because an address is allocated to each byte (8 bits) of data in a common data processor, a semiconductor device connected to the data processor is designed to read and write data on an address number basis. In addition, for the read data length, the semiconductor storage device is designed so that data which is $\frac{1}{2}^n$ times (n is an integer equal to or larger than 1) the basic data length and which is 8 bits or longer must be able to be read or written. That is, for the basic data length of 32 bits, 16 bits ($32 \times \frac{1}{2}^1$ bits), or 2 bytes, and 8 bits ($32 \times \frac{1}{2}^2$ bits), or 1 byte, must be able to be read or written. This will be described more in detail with reference to the drawings.

FIG. 3 schematically shows the physical array of data stored in a conventional semiconductor storage device connected to a data processor whose basic data length is 32 bits (4 bytes) and the logical operation executed when 32 bits of data is read from the storage device. The numeral 300 indicates data stored in the semiconductor storage device, and the numeral 301 indicates data read from the semiconductor storage device. In this case, 32 bits of data is read directly. That is, the semiconductor storage device is laid out and wired so that the relative distance between the nth bit of the data in the semiconductor storage device and the nth bit of the register into which the data is read becomes shortest.

FIG. 4 schematically shows the physical array of data stored in a conventional semiconductor storage device connected to a data processor whose basic data length is 32 bits (4 bytes) and the logical operation executed when 16 bits (2 bytes) of data are read from the storage device. The numeral 400 indicates data stored in the semiconductor storage device, and the numerals 401 and 402 indicate data read from the semiconductor storage device.

FIG. 4(a) shows how the low-order 16 bits (byte 1 and byte 0) of the data 400 are read, and FIG. 4(b) shows how the high-order 16 bits (bytes 3, byte 2) of the data 400 are read. It should be noted that, in FIG. 4(b), the bit shift operation is required for 16 bits, from the high-order 16 bits to the low-order 16 bits. In a conventional semiconductor storage device, the memory cell array is laid out in the data bit sequence. Therefore, to execute the operation shown in FIG. 4(b), the data must be physically shifted 16 bits. That is, in FIG. 4(a), the relative distance between the nth bit ($0 \leq n \leq 15$) of the semiconductor storage device and the nth bit ($0 \leq n \leq 15$) of the register into which data is read is shortest. On the other hand, in FIG. 4(b), the relative wiring length becomes longer because the n'th bit ($16 \leq n' \leq 31$) of the semiconductor storage device is stored in the nth bit ($0 \leq n \leq 15$) of the register into which data is read. This lengthens the wiring length, increases the wiring load, reduces the read speed, and increases the power consumption.

FIG. 5 schematically shows the physical array of data stored in a conventional semiconductor storage device connected to a data processor whose basic data length is 32 bits (4 bytes) and the logical operation executed when 8 bits (1 byte) of data are read from the storage device. The numeral 500 indicates data stored in the semiconductor storage device, and the numerals 501, 502, 503, and 504 indicate data read from the semiconductor storage device.

FIG. 5(a) shows how the 8 bits corresponding to byte 0 of the data 500 are read, FIG. 5(b) shows how the 8 bits corresponding to byte 1 of the data 500 are read, FIG. 5(c) shows how the 8 bits corresponding to byte 2 of the data 500 are read, and FIG. 5(d) shows how the 8 bits corresponding to byte 3 of the data 500 are read. It should be noted that the bit shift operation is required for 8 bits from byte 1 to byte 0 in FIG. 5(b), that the bit shift operation is required for 16 bits from byte 2 to byte 0 in FIG. 5(c), and that the bit shift operation is required for 24 bits from byte 3 to byte 0 in FIG. 5(b), respectively.

In a conventional semiconductor storage device, a memory cell array is laid out in data bit sequence. Therefore, when executing operation as shown in FIG. 5(b), FIG. 5(c), or FIG. 5(d), the 8-bit, 16-bit, or 24-bit physical shift operation must be executed, respectively. That is, as in FIG. 4(b), the relative wiring length becomes longer. This layout lengthens the wiring from each memory cell to the selector, increases the wiring load, reduces the read speed, and increases the power consumption. In addition, because 24 bit-shift signal lines sometimes run in parallel in some part of the above example as shown in FIG. 16(a), there are some problems; for example, the wiring area is increased, and the signal lines are so dense that they cause crosstalk between signal lines. On the other hand, there is another method in which data is always read into a register at memory access time, 32 bits at a time, and then only the necessary number of bits of the data are extracted by shifting the bits. However, this method requires a time for bit shift processing and thus reduces the read speed.

It is an object of the present invention to provide a storage device that solves the above problems, that reads or writes even data shorter than the basic data length, for example, reads 8 bits of data (that is, byte) speedily, and that requires less power.

It is another object of the present invention to provide a storage device that reduces an area occupied by the wiring and that minimizes the generation of crosstalk.

The above and other objects and the new features of the present invention will be made more apparent by the description in the specification and the accompanying drawings.

DISCLOSURE OF THE INVENTION

The overview of the typical contents of the present invention disclosed in this application will be described below.

That is, a storage device comprises a memory cell array comprising a plurality of memory cells; word lines used to select memory cells from the plurality of memory cells in response to an address signal; and bit lines used to read information stored in the selected memory cells, wherein the storage device is connected to an address bus and a data bus, and wherein a bit array of data stored in the memory array is different from a bit array in the data bus.

Information pieces transmitted via adjacent bit signal lines on the data bus are stored in the memory cells a predetermined number of bits apart.

In addition, more specifically, when a basic read unit is n bits, information pieces, whose logical bit positions are $0*8+k, 1*8+k, 2*8+k, 3*8+k, \ldots, m*8+k$ (where k and m are natural numbers, $0 \leq k \leq 7$ and $0 \leq m \leq n/8-1$), are stored in the memory cells close to one another in the memory cell array.

The means described above makes the wiring length for the bit shift operation at read time extremely short and therefore reads data speedily in units of bytes. At the same time, the means significantly reduces the amount of devices and wiring used to build a circuit for executing the bit shift operation, making a low-power storage device available. In addition, because the wiring length for the bit shift operation at data read time is relatively short, the means reduces both the area occupied by wiring and the number of signal lines running in parallel in the wiring area for the bit shift operation. Therefore, the means gives a storage device with a minimized wiring area and reduced crosstalk.

BEST MODE FOR CARRYING OUT THE INVENTION

A preferred embodiment of the present invention will be described below with reference to the attached drawings.

Figure 1:
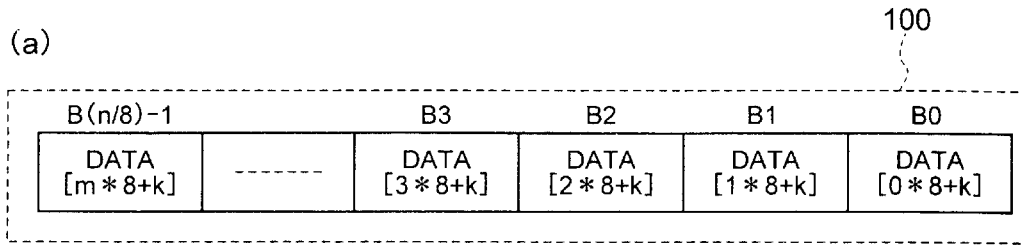
FIG. 1 is a schematic diagram showing the physical bit array of data stored in a memory cell array in a storage device according to the present invention.
Figure 1:
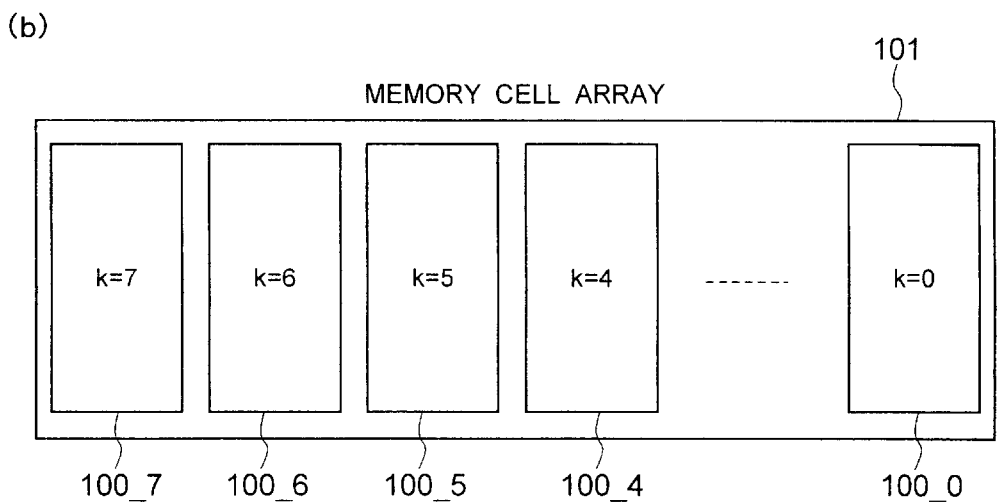
Figure 1:
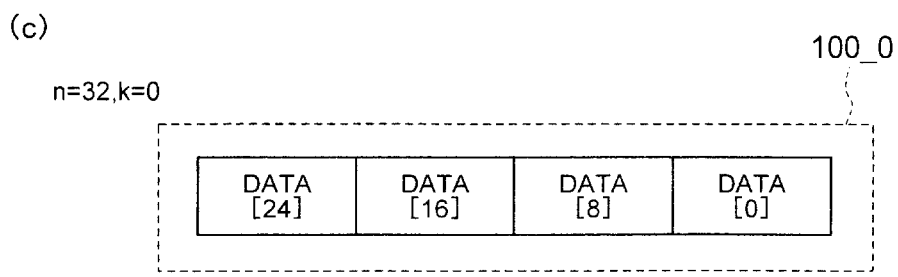

FIG. 1 is a schematic diagram showing the physical layout of a memory cell in a storage device according to the present invention. In the figure, k and m are natural numbers satisfying the following:

$0 \leq k \leq 7$ $0 \leq m \leq (n/8)-1$ n: Basic data size

The basic data size n refers to the number of data bits basically processed by a data processor such as a microprocessor or a microcomputer connected to a memory module composed of semiconductor storage devices or a plurality of memory chips to which the present invention is applied. Many data processors use 16, 32, 64, or 128 bits of data. For example, when the present invention is applied to a storage device connected to a data processor whose basic data size is 32 bits, the value of m is 0, 1, 2, or 3.

In FIG. 1(a), data[$0*8+k$] indicates one bit in the bit position $0*8+k$ in data whose basic data size is n bits. In the semiconductor storage device to which the present invention is applied, the memory cells in which the data units in the logical bit positions $0*8+k, 1*8+k, 2*8+k, 3*8+k, \ldots, m*8+k$, such as those shown in FIG. 1(a), are stored are laid out in neighboring positions as a group 100. That is, the group 100 includes n/8 bits of data. For example, when n=32, each group 100 is composed of 4 bits.

In FIG. 1(*a*), k is one of 0–7 in a group and, when k in data data [0*8+k] of block B0 is 0, k in data data[1*8+k]–data [m*8+k] in other blocks B1-B$_{n/8-1}$ is also 0. When n=32, group 100_0 corresponding to k=0 includes data [0], data [8], data[16], and data[24] as shown in FIG. 1(*c*). Similarly, group 100_1 corresponding to k=1 includes data[1], data [9], data[17], and data[24], and group 100_7 corresponding to k=7 includes data[7], data[15], data[23], and data[31].

Seven groups 100_0–100_7, each of which has the same bit value of k, are arranged as shown in FIG. 1(*b*) and are stored in a memory cell array 101. If 101 indicates the whole memory cell array in FIG. 1(*b*), each of groups 100_0–100_7 also includes the bits which are in other words (n-bit data at some other address) and each of which has the same value of k.

In the semiconductor storage device according to the present invention, groups 100_7, 100_6, 100_5, 100_4, 100_3, 100_2, 100_1, and 100_0 are arranged as shown in FIG. 1(*b*) to allow data, whose total number of bits is n, to be read and written. In the conventional semiconductor storage device, eight bits which has the same value of m and which range from 0 to 7 in the value of k are sequentially arranged in blocks B0–B7 in FIG. 1(*a*) and are stored there to form n-bit data as a whole. It is easily understood that the conventional method is apparently different from the method according to the present invention in which the bits with the same value of k are arranged in each of blocks B0–B7.

Figure 2:
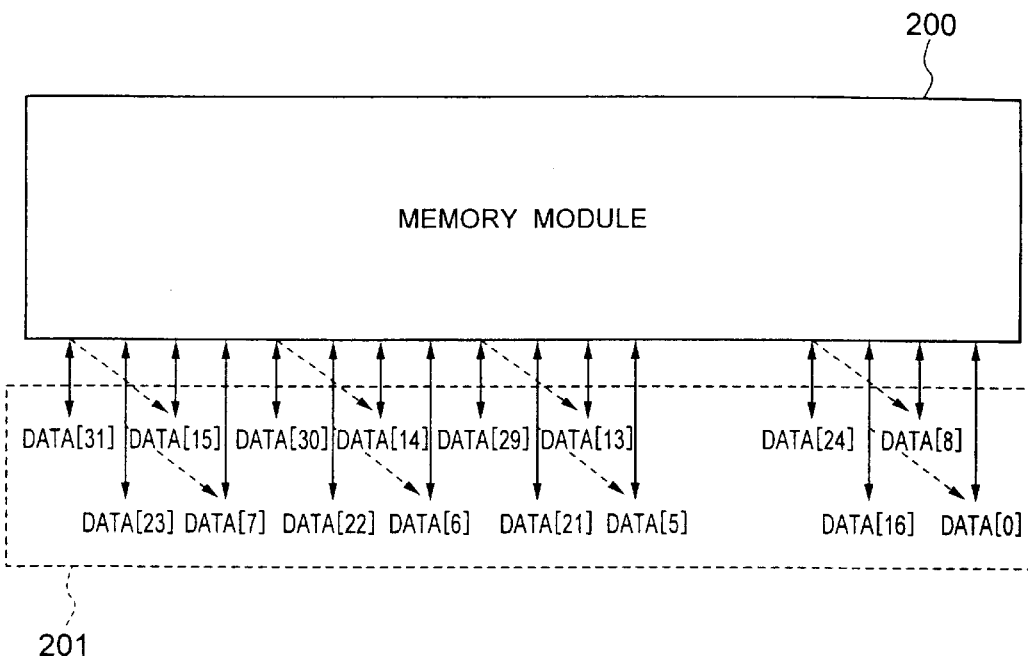
FIG. 2 is a diagram showing an example of a bit array when the storage device (memory module) according to the present invention is connected to a data processor whose basic data size is 32 bits.
Figure 3:
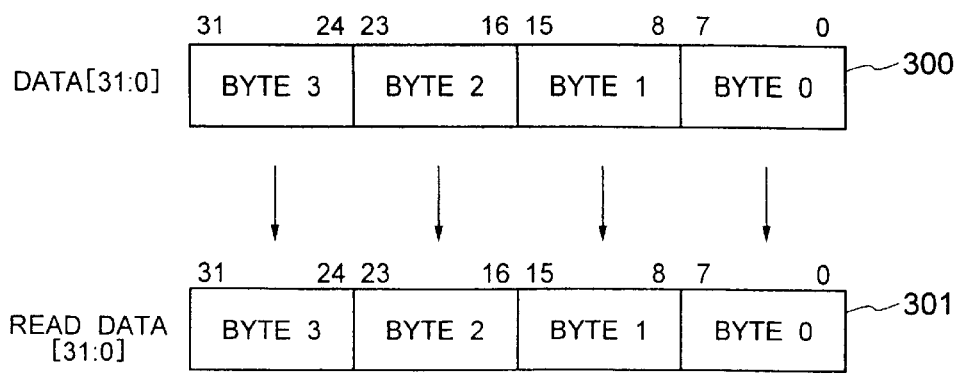
FIG. 3 is a schematic diagram showing a logical operation executed when 32 bits of data are read.

FIG. 2 shows an embodiment in which the present invention is applied to a storage device connected to a data processor whose basic data size is 32 bits. The numeral 200 indicates a memory module to which the present invention is applied, and the numeral 201 indicates data signals sent to, and received from, the memory module 200. The bit sequence of the data signals 201 corresponds to the physical bit sequence in the cell layout of the memory module 200.

Here, a memory module refers narrowly to a memory cell array included in a semiconductor memory chip, and generally to a storage device composed of a plurality of semiconductor memory chips. The present invention may be applied to a storage device with any configuration regardless of its size. In addition, the present invention may be applied not only to a volatile semiconductor storage device such as SRAM or DRAM but also to non-volatile semiconductor storage device such as EEPROM.

When a data processor reads or writes data, 32 bits (4 bytes) at a time, 32 bits of data ranging from data[0] to data[31] are read at the same time from the memory module 200 in FIG. 2, and data is also written, 32 bits at a time. When a data processor reads data, for example, 16 bits (2 bytes) at a time, the bits are shifted as shown by the broken lines in the figure when the high-order 16 bits ranging from data[16]–data[31] are read from the memory module 200 in FIG. 2. The reverse shift operation is performed when data is written. This bit shift corresponds to the bit shift shown in FIG. 4(*b*).

Figure 5:
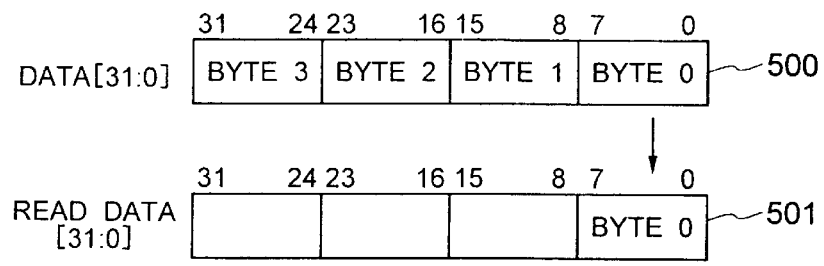
FIG. 5 is a schematic diagram showing a logical operation executed when 8 bits of data are read.
Figure 5:
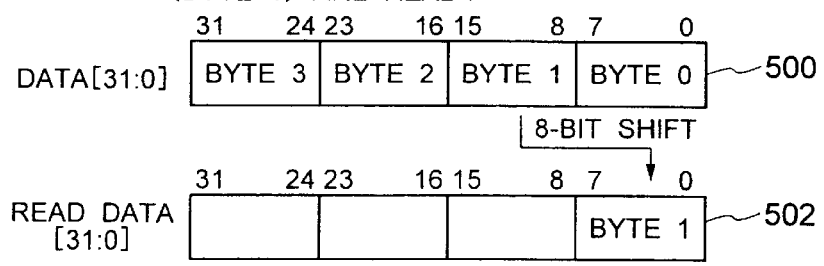
Figure 5:
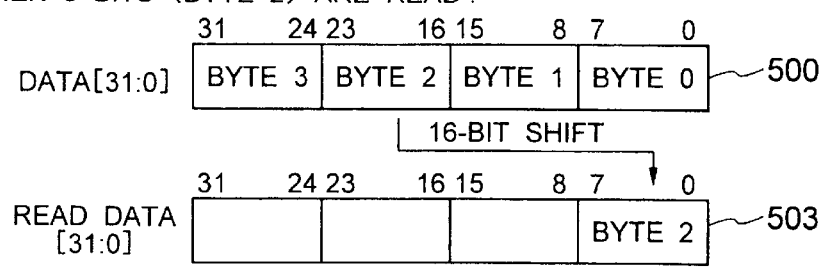
Figure 5:
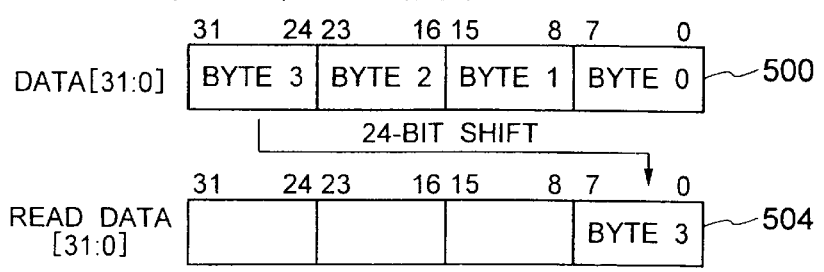
Figure 16:
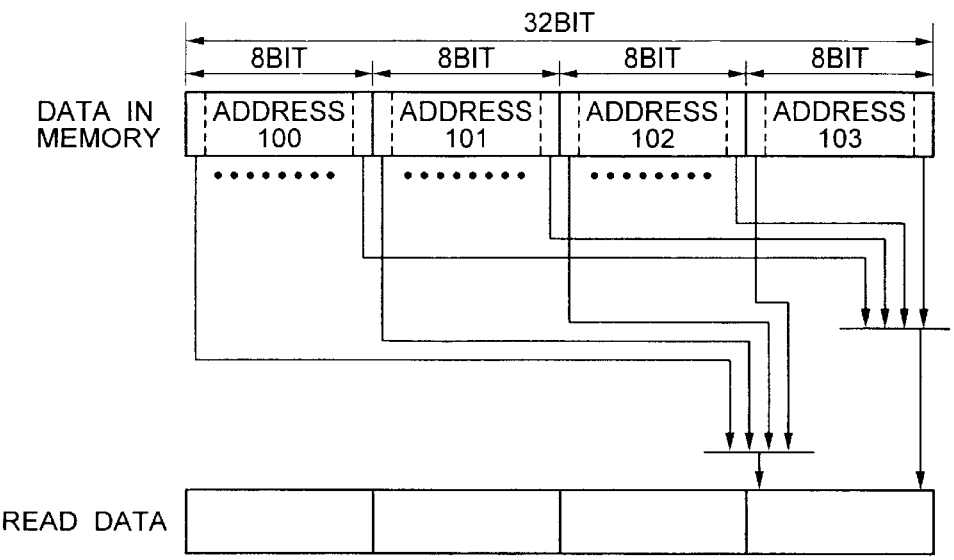
FIG. 16 is a diagram schematically showing a method in which 8-bit data is read from a memory cell array in which data is stored in units of 32 bits in the conventional semiconductor storage device and a similar read method according to the present invention.
Figure 16:
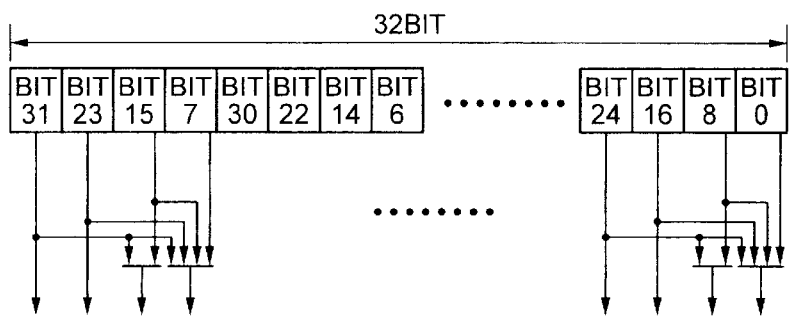

When a data processor reads or writes data, for example, 8 bits (1 byte) at a time, the bit shift corresponding to the bit shift in FIGS. 5(*b*)–(*d*) is also executed when bit data[8]–data[15], data[16]–data[23], and data[24]–data[31] are read from the memory module 200 in FIG. 2. However, since the bit shift is executed only for the n/8 bits (for example, 4 bits for 32-bit data) that are near each other, the wiring length for the bit shift is extremely short as shown in FIG. 16(*b*). In addition, unlike the conventional method that requires many signal lines for the bit shift, n/8 lines is required at the most.

As it is apparent from FIG. 2, the positions of the bits that are read are different from the logical bit positions. That is, although the logical bit positions are in sequence of data[0]–data[31], the bit positions in the embodiment is in sequence of data[0], data[8], data[16], data[24], . . . , data[23], and data[31]. Thus, the bits are rearranged inside or outside the memory module. When data is written, the bits are also rearranged in the reverse sequence. This bit rearrangement may be made on a hardware basis in the memory module or on a software basis in the data processor.

Figure 6:
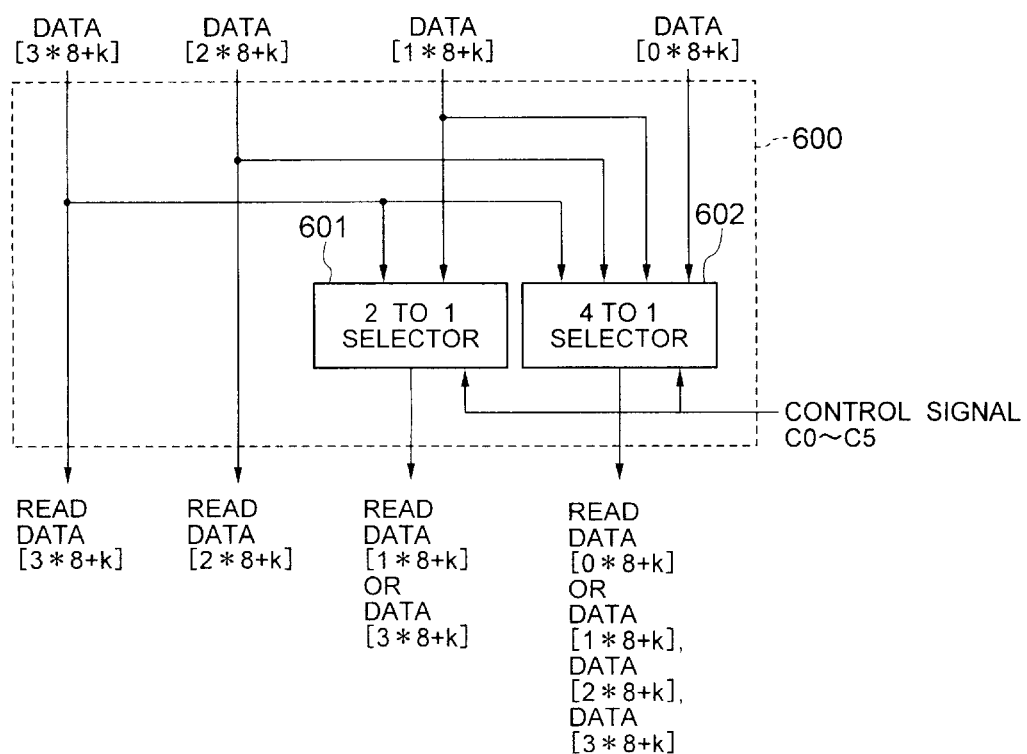
FIG. 6 is a block diagram showing an example of the configuration of a bit shift circuit that allows 32-bit data, 16-bit data, and 8-bit data to be read.

FIG. 6 shows an example of the configuration of a bit shift circuit 600, capable of shifting bits when data is read 8 bits at a time as shown above from the group 100 shown in FIG. 1, when the basic data length is 32 bits, that is, m=3.

In FIG. 6, the numerals 601 and 602 indicate selector circuits, respectively. The 2 to 1 selector 601 is a selector that selects one of data[3*8+k] and data[1*8+k], and the 4 to 1 selector 602 is a selector that selects one of data[3*8+k], data[2*8+k], data[1*8+k], and data[0*8+k]. The selection operation is controlled by the control signals C0–C5. For example, when the bit shift operation corresponding to FIG. 4(*b*) is executed, the selector 601 selects data[3*8+k] and the selector 602 selects data[2*8+k], and they output the selected data to the second bit and the first bit, respectively. When the bit shift operation corresponding to FIG. 5(*b*) is executed, the selector 602 selects data[1*8+k] and outputs the selected data to the first bit; when the bit shift operation corresponding to FIG. 5(*c*) is executed, the selector selects data[2*8+k] and outputs the selected data to the first bit; and when the bit shift operation corresponding to FIG. 5(*d*) is executed, the selector selects data[3*8+k] and outputs the selected data to the first bit.

As it is clear from the embodiment, the bit arrangement method shown in FIG. 1(*a*) requires the bits to be shifted only 3 bits at the most even when the 24-bit shift operation is logically required from the layout point of view, thus reducing the wiring length by ⅛ as compared with that in the conventional method. Therefore, this arrangement increases the read speed and reduces the power consumption caused by the wiring load capacity. Although not always required, "0" is added, when reading 16-bit data or 8-bit data, to the high-order bit positions that are not significant and data with the total length of n is output. In this specification, those bits of the 16 bits or 8 bits actually read from the n bits are called significant bits.

Figure 7:
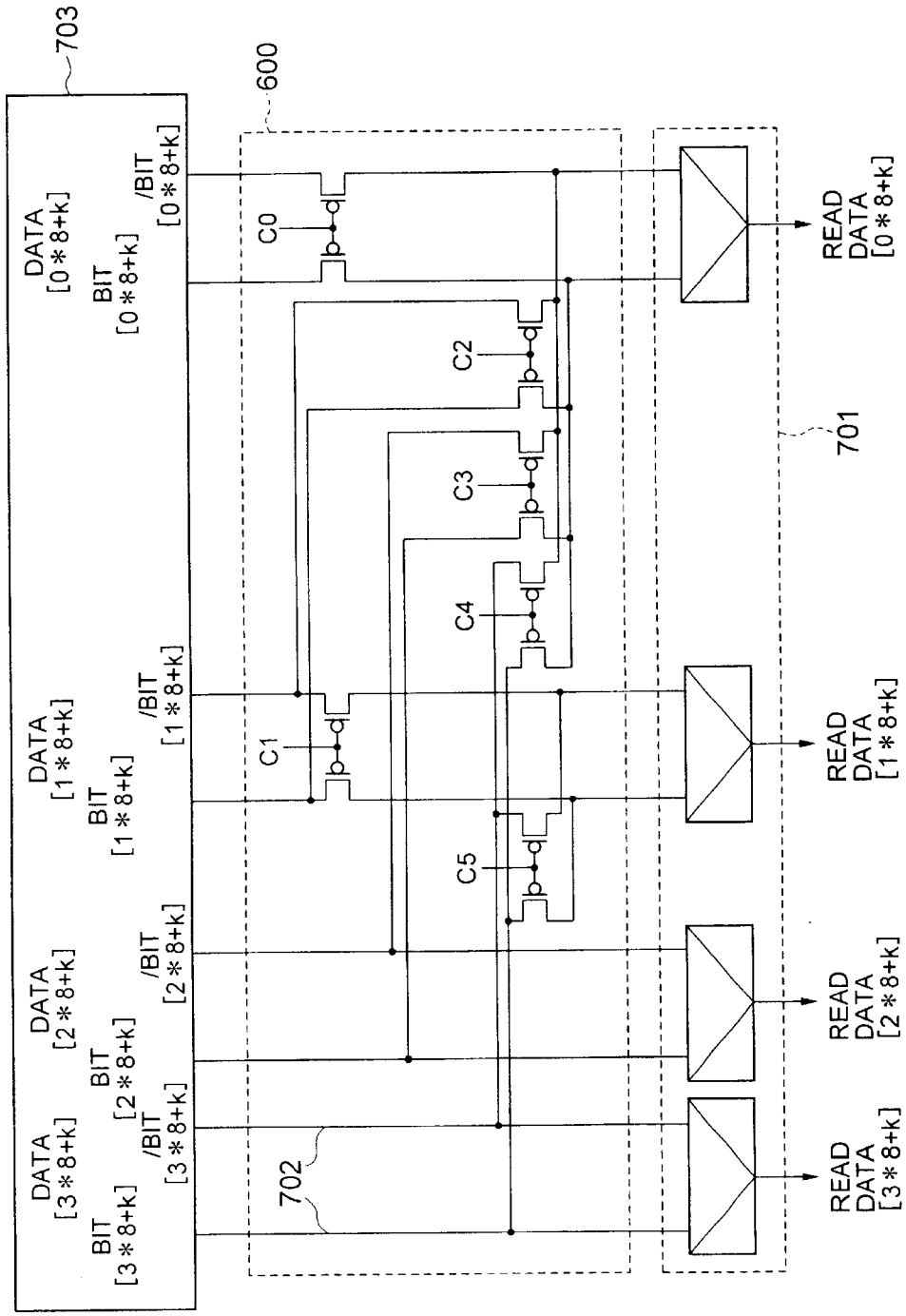
FIG. 7 is a circuit diagram showing an actual example of the bit shift circuit.

FIG. 7 shows an example of the bit shift circuit 600, shown in FIG. 6, that is actually configured. In this embodiment, the bit shift circuit 600 for use when the basic data length is 32 bits is configured with P-channel MOS transistors and is controlled by the control signals C0, C1, C2, C3, C4, and C5. The numeral 702 indicates a complementary bit line pair. From left to right, they are bit lines bit[3*8+k]/bit[3*8+k] corresponding to data[3*8+k], bit lines bit[2*8+k]/bit[2*8+k] corresponding to data[2*8+k], bit lines bit[1*8+k]/bit[1*8+k] corresponding to data[1*8+k], and bit lines bit[0*8+k]/bit[0*8+k] corresponding to data[0*8+k], respectvely.

The numeral 703 schematically indicates a memory cell array in which data[3*8+k], data[2*8+k], data[1*8+k], and data[0*8+k] are stored. The numeral 701 indicates sense amplifier circuits that amplify data read from the memory cell array 703 via the bit shift circuit 600.

Figure 4:
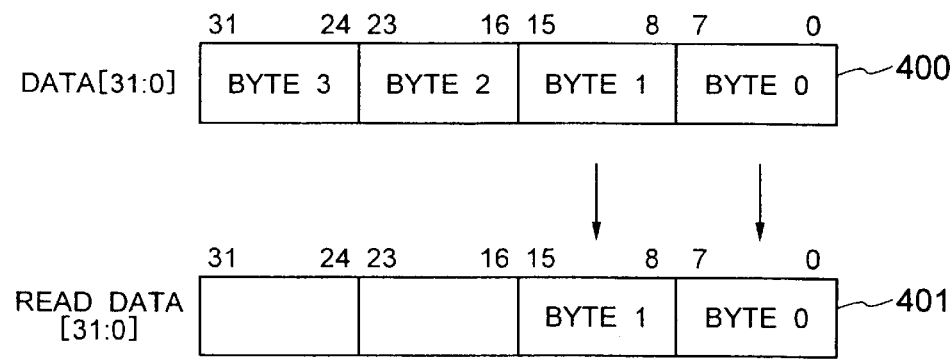
FIG. 4 is a schematic diagram showing a logical operation executed when 16 bits of data are read.
Figure 4:
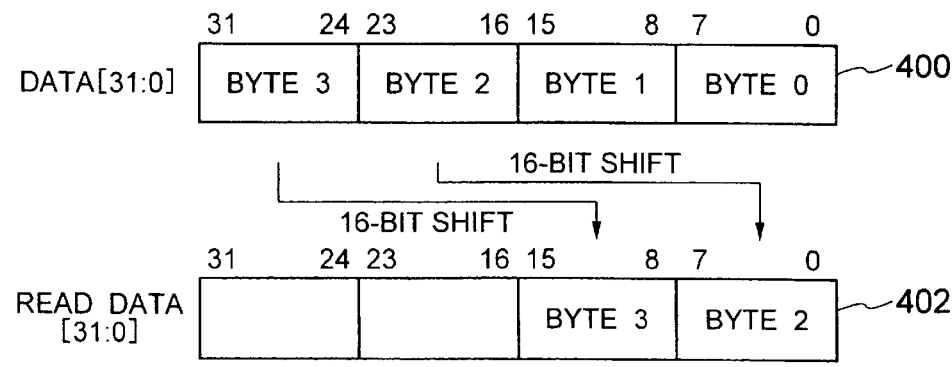

For example, when the shift operation corresponding to FIG. 4(*b*) is executed, the control signals C0, C1, C2, and C4 of the bit shift circuit 600 are set to the power voltage level (H level), and C3 and C5 to the ground voltage level (L level). Also, when the shift operation corresponding to FIG.

5(d) is executed, the control signals C0, C2, C3 and C5 of the bit shift circuit 600 are set to the power voltage level (H level), and C4 to the ground voltage level (L level)

Table 1, shown below, lists the combination of control signals C0, C1, C2, C3, C4, and C5 for the shift operation corresponding to FIG. 4(b) that is executed when 32 bits and 16 bits are read, and for the shift operation corresponding to FIGS. 5(b)–(d) that is executed when 8 bits are read.

TABLE 1

|    | Read 32 bits | Read 16 bits Shift in FIG. 4b | Read 8 bits |         |         |
|----|--------------|-------------------------------|-------------|---------|---------|
|    |              |                               | FIG. 5b     | FIG. 5c | FIG. 5d |
| C0 | L            | H                             | H           | H       | H       |
| C1 | L            | H                             | H           | H       | H       |
| C2 | H            | H                             | L           | H       | H       |
| C3 | H            | L                             | H           | L       | H       |
| C4 | H            | H                             | H           | H       | L       |
| C5 | H            | L                             | H           | H       | H       |

In this embodiment, even when shifting data[3*8+k] to read data[0*8+k], the high-speed operation is possible because the wiring length is shorter than that of the conventional method. In addition, the amount of devices and wires required for implementing the bit shift circuit 600 is so small that the power consumption is low.

Figure 8:
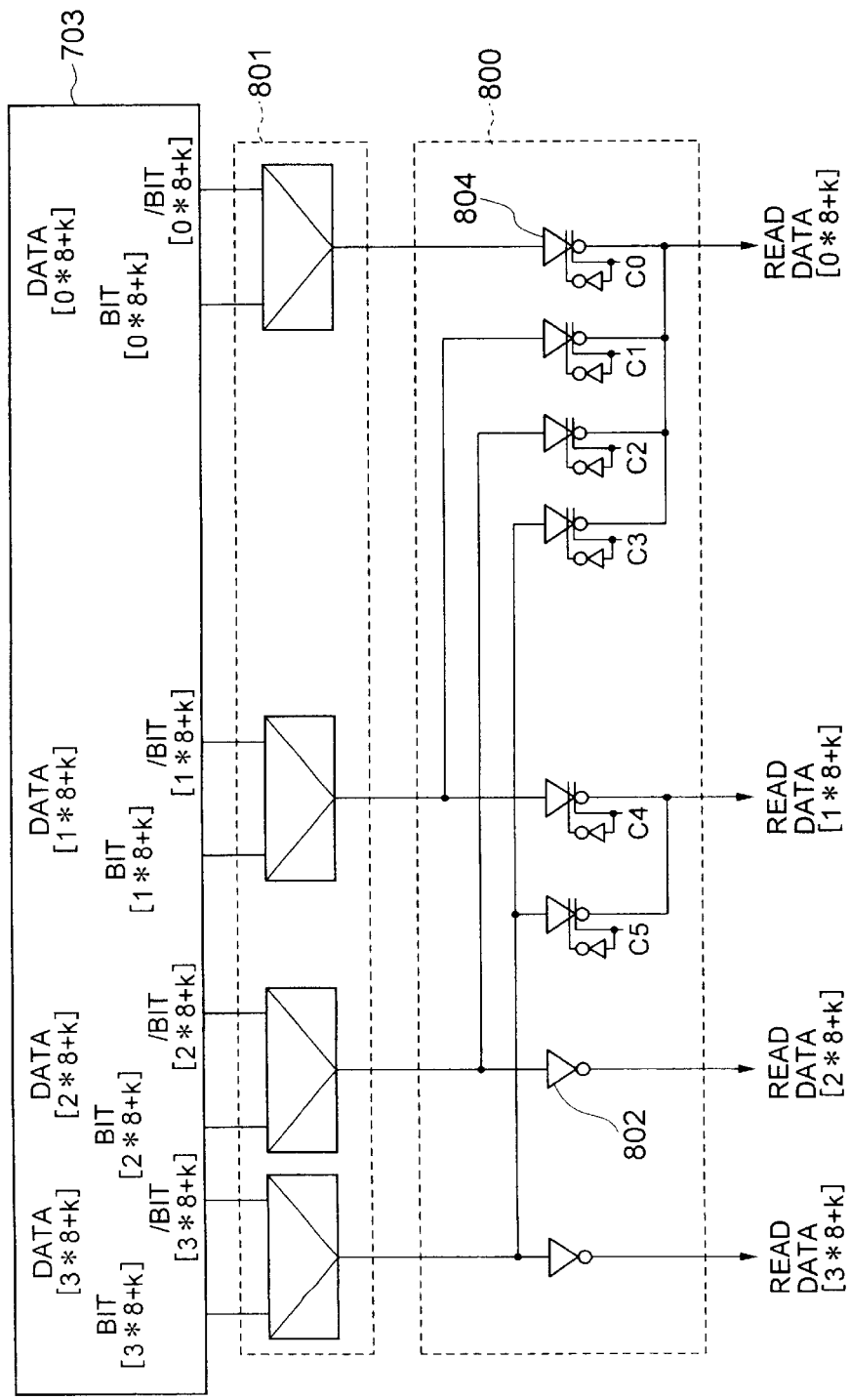
FIG. 8 is a circuit diagram showing another example of the bit shift circuit.

FIG. 8 shows another example of the bit shift circuit 600, shown in FIG. 6, that is actually configured. In this embodiment, the bit shift circuit 800 for use when the basic data length is 32 bits is configured with tri-state inverters 804 and inverters 802 and is controlled by the control signals C0, Cl, C2, C3, C4, and C5. The numeral 803 schematically shows a memory cell array in which data[3*8+k], data[2*8+k], data[1*8+k], and data[0*8+k] are stored. The numeral 801 indicates sense amplifier circuits that amplify data output from the memory cell array 803 via the complementary bit line pairs. For example, when the shift operation corresponding to FIG. 4(b) is executed, the control signals C0, C1, C3, and C4 of the bit shift circuit 800 are set to the ground voltage level (L level), and C2 and C5 to the power voltage level (H level). Also, when the shift operation corresponding to FIG. 5(d) is executed, the control signals C0, C1, C2, C4, and C5 of the bit shift circuit 800 are set to the ground voltage level, and C3 to the power voltage level (H level).

Table 2, shown below, lists the combination of control signals C0, C1, C2, C3, C4, and C5 for the shift operation corresponding to FIG. 4(b) that is executed when 32 bits and 16 bits are read, and for the shift operation corresponding to FIGS. 5(b)–(d) that is executed when 8 bits are read.

TABLE 2

|    | Read 32 bits | Read 16 bits Shift in FIG. 4b | Read 8 bits |         |         |
|----|--------------|-------------------------------|-------------|---------|---------|
|    |              |                               | FIG. 5b     | FIG. 5c | FIG. 5d |
| C0 | H            | L                             | L           | L       | L       |
| C1 | L            | L                             | H           | L       | L       |
| C2 | L            | H                             | L           | H       | L       |
| C3 | L            | L                             | L           | L       | H       |
| C4 | H            | L                             | L           | L       | L       |
| C5 | L            | H                             | L           | L       | L       |

In this embodiment, even when data[3*8+k] is shifted into read data[0*8+k], data may be read via one stage of tri-state inverters. Judging from the fact that one or more stages of inverters are generally required for the output of the sense amplifiers, it is apparent that data may be read speedily. In addition, the amount of devices and wires required for implementing the bit shift circuit 800 is so small that the power consumption is low.

Figure 9:
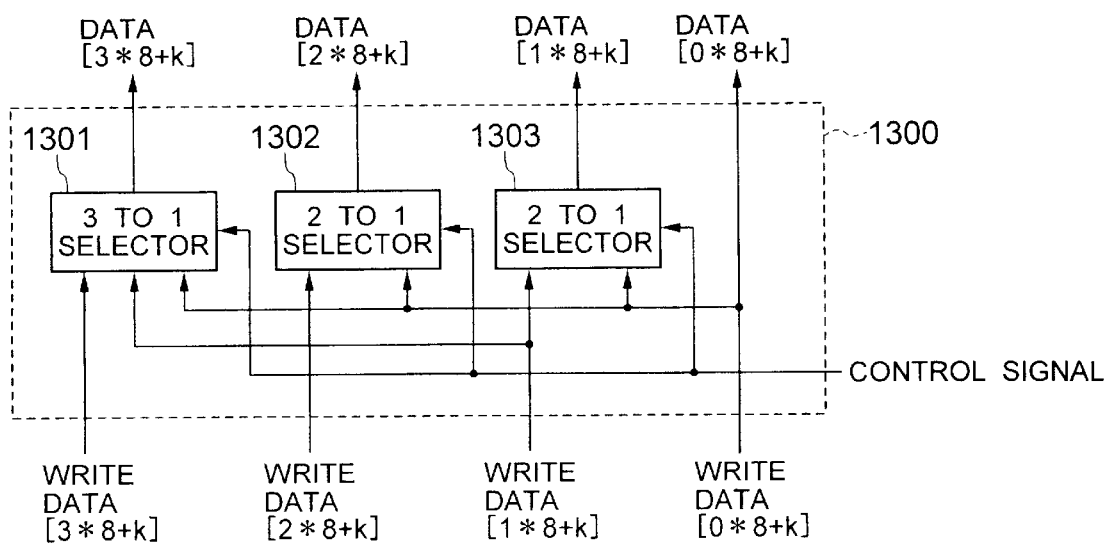
FIG. 9 is a block diagram showing an example of the configuration of the bit shift circuit that allows 32-bit data, 16-bit data, and 8-bit data to be written.

FIG. 9 shows a bit shift circuit 1300, for use with the basic data length of 32 bits (or m=3), that performs the reverse of the bit shift operation, shown in FIG. 6, when data is written in a form corresponding the group 100 shown in FIG. 1, 32 bits, 16 bits, or 8 bits at a time.

In FIG. 9, the numerals 1301, 1302, and 1303 are selector circuits, respectively. A 3 to 1 selector 1301 is a selector that selects one of write data bits write data[3*8+k], write data[1*8+k], and write data[0*8+k] and supplies the selected data to the memory cell in which data[3*8+k] is stored, a 2 to 1 selector 1302 is a selector that selects one of write data[2*8+k] and write data[0*8+k] and supplies the selected data to the memory cell in which data[2*8+k] is stored, and a 2 to 1 selector 1303 is a selector that selects one of write data[1*8+k] and write data[0*8+k] and supplies the selected data to the memory cell in which data[1*8+k] is stored. Their operations are controlled by a combination of control signals.

More specifically, when write data is 32 bits long, the selector 1301 selects write data[3*8+k], the selector 1302 selects write data[2*8+k], and the selector 1303 selects write data[1*B+k], respectively. When write data is the high-order 16 bits of 32 bits, the selector 1301 selects write data[1*8+k] and the selector 1302 selects write data[0*8+k], respectively, and the selector 1303 does not select any data. On the other hand, when write data is the low-order 16 bits of 32 bits, the selectors 1301 and 1302 do not select any data and the selector 1301 selects write data[1*8+k].

In addition, when write data is byte 3 that is the highest-order byte of 32 bits, the selector 1301 selects write data [0*8+k]; when write data is byte 2 of 32 bits, the selector 1302 selects write data[0*8+k]; and when write data is byte 1 of 32 bits, the selector 1301 selects write data[0*8+k], respectively. When write data is byte 0 of 32 bits, selectors 1301–1303 do not select any data.

Not only for the read operation but also for the write operation, the method in this embodiment requires the bits to be shifted only 3 bits from the layout point of view even when the 24-bit shift operation is logically required, thus reducing the wiring length by ⅛ as compared with that in the conventional method and making high-speed, low-power write operation possible.

Figure 10:
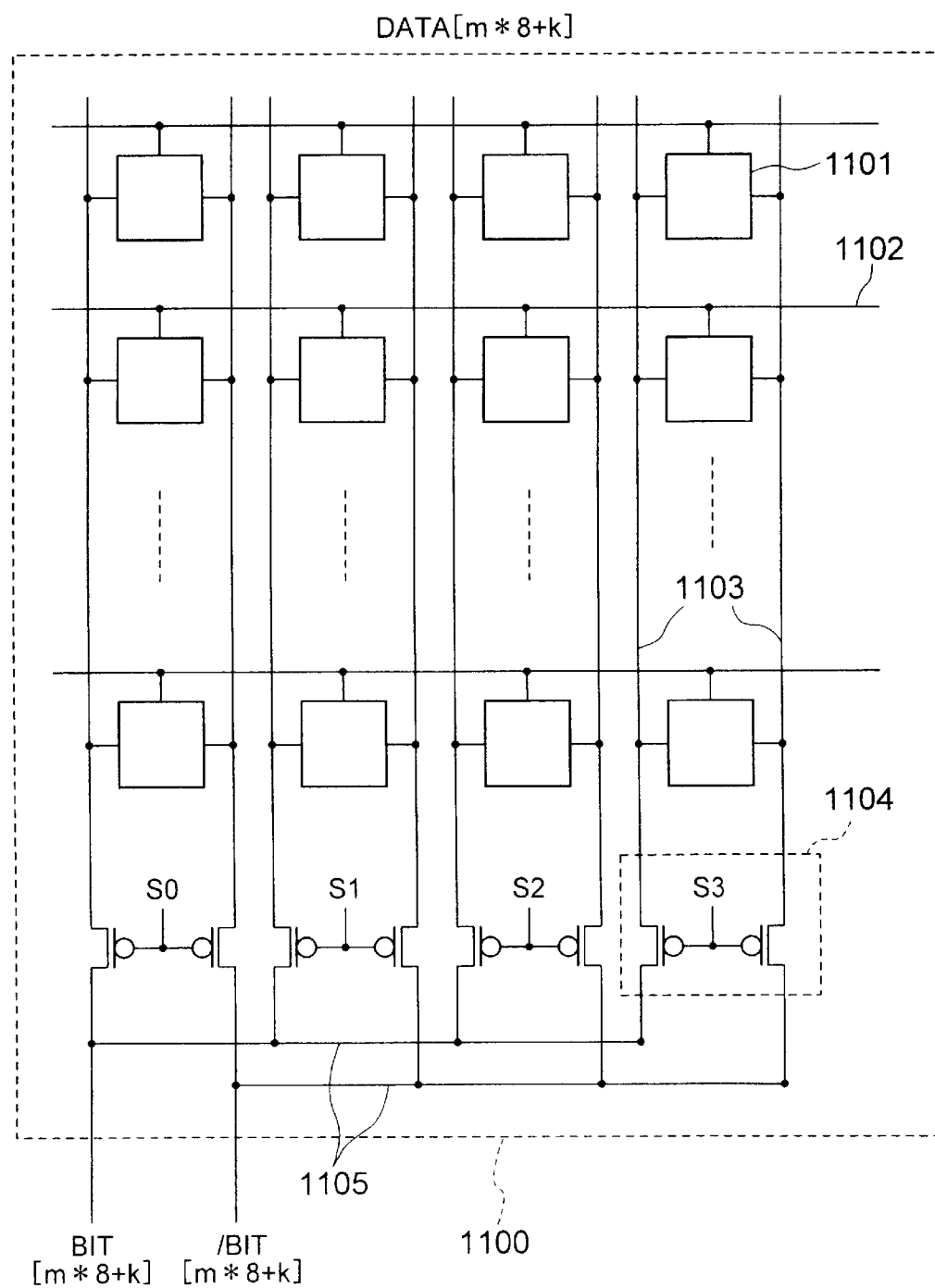
FIG. 10 is a circuit diagram showing an embodiment of a local memory cell array in which one bit of data in FIG. 1 is stored.

FIG. 10 shows an example of the layout of a memory cell array in which logical 1-bit data[m*8+k] shown in FIG. 1(a) is stored, assuming that the array is built with an SRAM.

In FIG. 10, the numeral 1100 indicates a memory block in which 1-bit data[m*8+k] in the same logical positions of a plurality of n-bit data units (other words), each at its own address, are stored. n or an integral multiple of n memory blocks 1100 in this configuration are grouped to form a memory cell array. The numeral 1101 indicates an SRAM memory cell in which 1-bit of data is stored, the numeral 1102 indicates a word line used to select a memory cell, the numeral 1103 indicates a complementary bit line pair to which the input/output nodes of memory cells are connected, the numeral 1104 indicates a column switch composed of a P-channel MOS transistor, and the numeral 1105 indicates a common bit line pair.

When an address signal is received, the decoder circuit provided near the memory cell array decodes the address signal, sets one word line 1102 of each memory block to the selection level and, at the same time, causes one column switch 1104 to conduct. This allows a total of n bits of data, one bit from each of n memory blocks, to be read via the common bit line pair 1105 corresponding to one address.

Although, in the description with reference to FIG. 1, the memory cell array storing therein the logical 1-bit data [m*8+k] shown in FIG. 1(*a*) is arranged in the same column in the layout, the memory cell array may be composed of a plurality of columns in the layout as shown in the example in FIG. 10. In addition, although the memory cell array storing therein logical 1-bit data[m*8+k] is composed of 4 columns in FIG. 10, the memory cell array need not be limited to four columns; instead, the memory cell array may be composed of any number of columns such as 1 column, 2 columns, or 8 columns.

Figure 11:
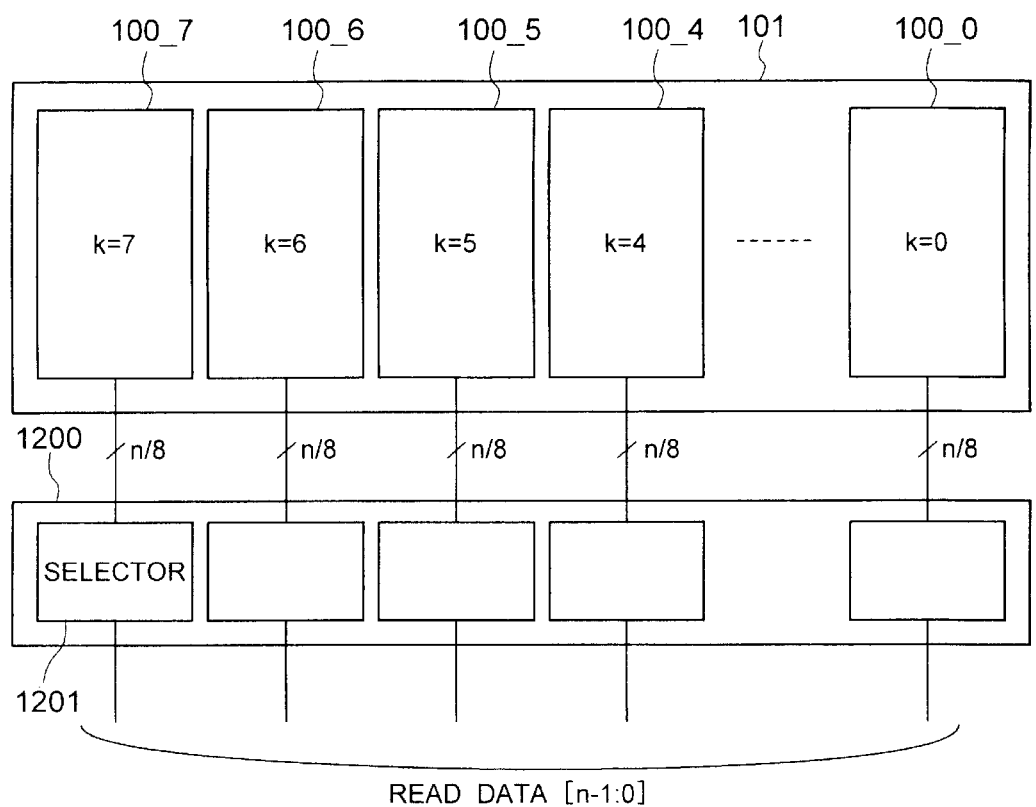
FIG. 11 is a schematic diagram showing an example of the layout of the memory cell array and the bit shift circuit in a semiconductor storage device to which the present invention is applied.

FIG. 11 schematically shows the circuit layout image that is a combination of the memory array 101 shown in FIG. 1, the bit shift circuit 600 for reading shown in FIG. 6, and the bit shift circuit 1300 for writing shown in FIG. 9. In FIG. 11, the numeral 1200 indicates a bi-directional bit shift circuit and the numeral 1201 indicates a circuit including the bit shift circuits 600 and 1300 described above. As it is clear from this embodiment, the bi-directional bit shift circuit 1200, which is able to orderly arrange the unit bit shift circuits 1201 corresponding to the memory cells in which data of the groups 100_0–100_7 is stored, reduces wasteful space and increases layout efficiency.

Figure 12:
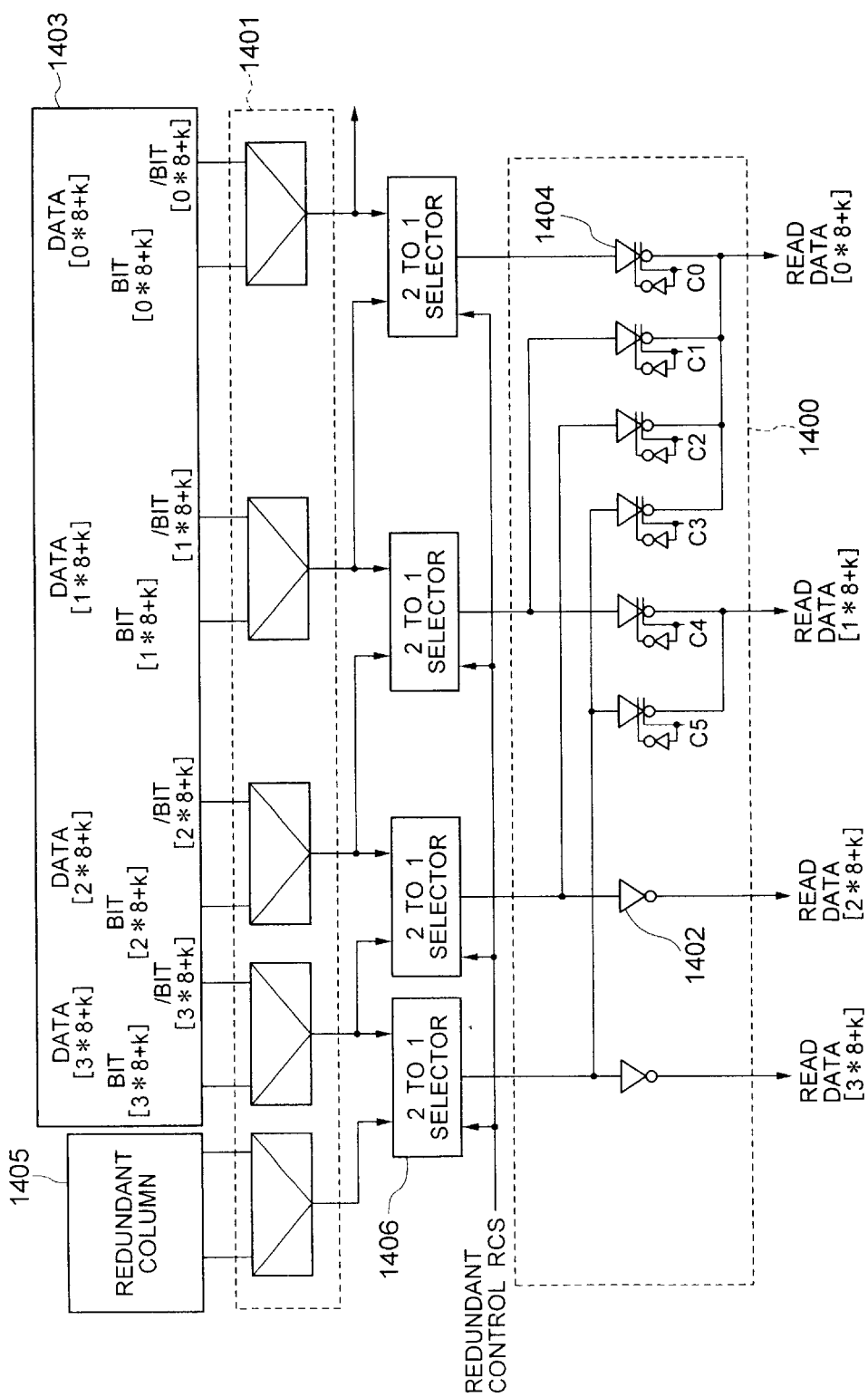
FIG. 12 is a block diagram showing an embodiment in which the present invention is applied to a semiconductor storage device in a redundant configuration.

FIG. 12 is an embodiment in which the bit shift circuit in FIG. 8 is applied to a storage device with a redundant column. The numeral 1400 indicates a bit shift circuit for use when the basic data length is 32 bits. As with the circuit in the embodiment shown in FIG. 8, this circuit is composed of tri-state inverters 1404 and inverters 1402 and is controlled by control signals C0, C1, C2, C3, C4, and C5. The numeral 1403 schematically indicates a memory cell array in which bits data[3*8+k], data[2*8+k], data[1*8+k], and data[0*8+k] are stored. The numeral 1405 indicates a redundant column composed of auxiliary memory cells to be used when there are defective columns in the memory cell array 1403.

The numeral 1401 indicates sense amplifier circuits that amplify data output from the memory cell array 1403 and the redundant column 1405 via the complementary bit line pairs. The numerals 1406–1409 indicate 2 to 1 selectors that switch the signal path, through which the output of the sense amplifiers is sent to the bit shift circuit 1400, depending upon whether or not the redundant column is used. Those selectors are controlled by the redundant control signal RCS. As shown in the figure, each of the 2 to 1 selectors 1406–1409 is configured to select one of the amplification signals of two adjacent bits and transmit the selected signal to the bit shift circuit 1400.

For example, when the column in which the bit data[3*8+k] shown in FIG. 12 is stored is defective, the data of data[3*8+k] is stored in the redundant column 1405. Then, the selector 1406 selects the output of the sense amplifier of the redundant column and transmits the output to the bit shift circuit 1400. In this case, the other selectors 1407–1409 select the output of the corresponding sense amplifiers and transmit the output to the bit shift circuit 1400.

Also, when the column in which data[2*8+k] is stored is detective, the data of data[2*8+k] is stored in the data[3*8+k] column. In this case, the selector 1406 selects the output of the sense amplifier corresponding to the redundant column and transmits the output to the bit shift circuit 1400, and the selector 1407 selects the output of the sense amplifier corresponding to the data[3*8+k] column and transmits the output to the bit shift circuit 1400. In this case, the other selectors 1408 and 1409 select the output of the corresponding sense amplifiers and transmit the output to the bit shift circuit 1400.

Similarly, when the column in which data[1*8+k] is stored is detective, the data of data[1*8+k] is stored in the data[2*8+k] column. In this case, the selector 1406 selects the output of the sense amplifier corresponding to the redundant column and transmits the output to the bit shift circuit 1400, the selector 1407 selects the output of the sense amplifier corresponding to the data[3*8+k] column and transmits the output to the bit shift circuit 1400, and the selector 1408 selects the output of the sense amplifier corresponding to the data[2*8+k] column and transmits the output to the bit shift circuit 1400. In this case, the other selector 1409 selects the output of the corresponding sense amplifier and transmits the output to the bit shift circuit 1400.

In addition, when the column in which data[0*8+k] is stored is detective, the data of data[0*8+k] is stored in the data[1*8+k] column. The selector 1406 selects the output of the sense amplifier corresponding to the redundant column and transmits the output to the bit shift circuit 1400, the selector 1407 selects the output of the sense amplifier corresponding to the data[3*8+k] column and transmits the output to the bit shift circuit 1400, the selector 1408 selects the output of the sense amplifier corresponding to the data[2*8+k] column and transmits the output to the bit shift circuit 1400, and the selector 1409 selects the output of the sense amplifier corresponding to the data[1*8+k] column and transmits the output to the bit shift circuit 1400.

As it is apparent from the embodiment in FIG. 12, the advantage of the present invention is not reduced even when the present invention is applied to a storage device with a redundant column. Although the selectors 1406–1409 are placed after the sense amplifiers 1401 in this embodiment, the present invention is not limited to this configuration. The selectors 1406–1409 may be placed before the sense amplifiers 1401.

<APPLICATION EXAMPLES>

Figure 13:
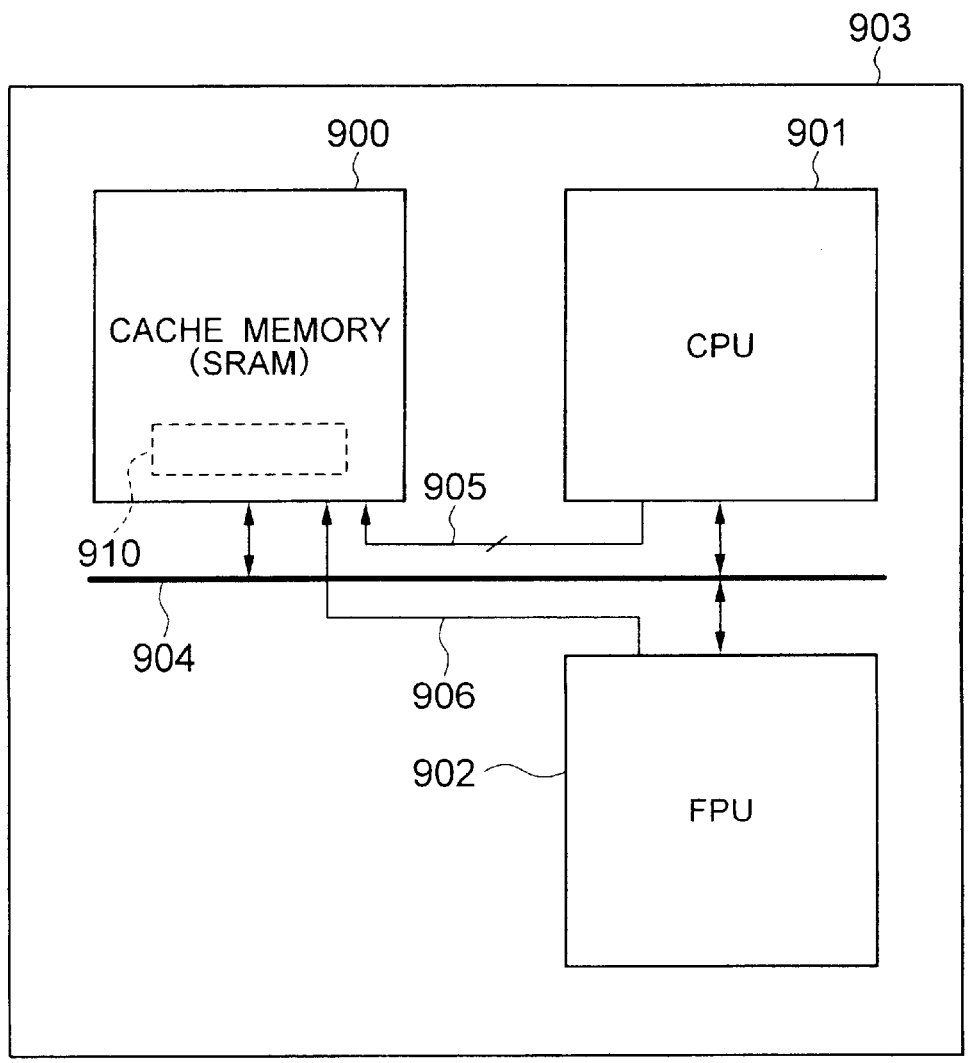
FIG. 13 is a block diagram showing an example of the configuration of a microcomputer system that is an example of an application system of the semiconductor storage device to which the present invention is applied.

FIG. 13 shows an example of the configuration of a system in which the semiconductor storage device according to the present invention is applied as a cache memory. The numeral 900 indicates a cache memory composed of an SRAM (Static Random Access Memory) to which the present invention is applied, the numeral 901 indicates a central processing unit (CPU), the numeral 902 indicates a floating-point processing unit (FPU), and the numeral 904 indicates a data bus connecting the cache memory 900, CPU 901, and FPU 902. Those components constitute a microcomputer system 903.

Although not shown in the figure, an address bus is provided, in addition to the data bus 904 described above, to supply an address signal from the CPU 901 to the cache memory 900. Note that the numerals 905 and 906 indicate the lines, through which control signals (so-called byte codes) used to instruct the cache memory 900 of the read data length, are supplied. When the CPU 901 processes data whose basic data length is 32 bits, data is read in units of bytes but written at a fixed length such as 32 bits.

In this system, an array of bit data, such as 32-bit data, output from the CPU 901 to the data bus 904 is in a common sequence, for example, in sequence of bit 0, bit 1, bit 2, bit 3, ..., and bit 31 as in the conventional system. On the other hand, the cache memory 900, into which this array of data is input, has a data alignment circuit 910 installed that rearranges received data into an array such as the one shown in FIG. 1(a). When data is output from the cache memory 900 to the data bus 904, the data alignment circuit 910 rearranges the data of the bit array, such as the one shown in FIG. 1(a) that is in the sequence specific to the present invention, into an array in which data is in the common sequence.

Figure 15:
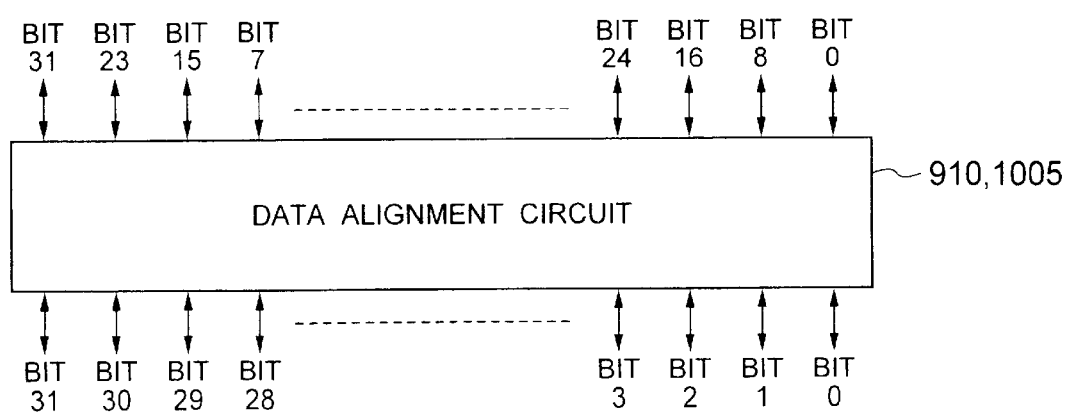
FIG. 15 is a functional diagram showing the array of input/output signals of a data alignment circuit that rearranges the bits when the data length is 32 bits.

FIG. 15 shows the arrangement of the input/output signals of the data alignment circuit 910 that rearranges the bits when the data length is 32 bits. In this figure, the signals bit31–bit0 in the top are the signals of the memory array, and the signals in the bottom are the signals of the data bus. The symbol "bit" in this figure is equivalent to "data" in FIG. 1. Even when 16 bits or 8 bits of data are read when the data length is 32 bits long, the data alignment circuit 910 performs the similar bit rearrangement for the significant bit part. The system may also be configured to allow one circuit or one circuit block to perform both the bit rearrangement executed by the data alignment circuit 910 and the bit shift executed by the bit shift circuit 600.

When the CPU 901 that processes 32-bit data makes a data request in units of 8 bits or 16 bits via a control signal line 905, the data alignment circuit 910 rearranges 8 bit or 16 bits of data read from the memory cell array and, at the same time, outputs the data to the data bus 904 with "0" padded in the high-order 24 bits or 16 bits although the data alignment circuit 910 is not always required to do so.

Figure 14:
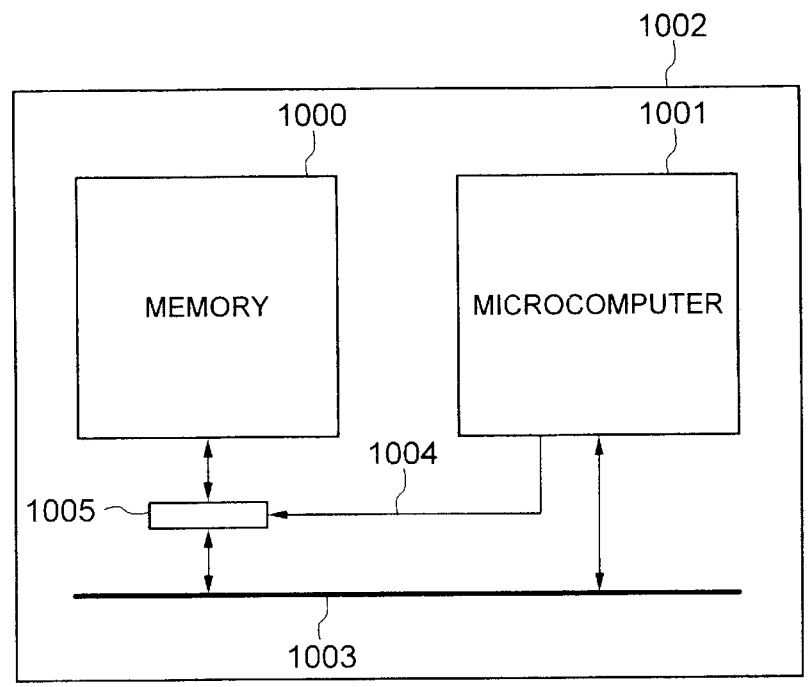
FIG. 14 is a block diagram showing another example of the configuration of a microcomputer system that is an example of an application system of the semiconductor storage device to which the present invention is applied.

FIG. 14 shows an example of the configuration of a system in which the semiconductor storage device according to the present invention is applied as a main memory. The numeral 1000 indicates a main memory composed of a DRAM (Dynamic Random Access Memory) to which the present invention is applied, the numeral 1001 indicates a microprocessor, the numeral 1003 indicates a data bus between the main memory 1000 and the microprocessor 1001, and the numeral 1004 indicates a control signal line through which the length of data to be read into the main memory 1000 is specified. The numeral 1005 indicates a data alignment circuit that rearranges data in a bit array provided from microprocessor 1001, which is in a common sequence either in ascending sequence, that is, the sixth bit is next to the first bit, the first bit is next to the second bit, and so on, or in descending sequence, to the bit array shown in FIG. 1(a) that is specific to the present invention. This circuit also rearranges the bit array of data, read from the memory array, in a sequence opposite to that described above. The main memory 1000, microprocessor 1001, data bus 1003, and data alignment circuit 1005 constitute a microcomputer system 1004.

The main memory 1000 and the microprocessor 1001 may be integrated on the same chip or on separate chips. The main memory 1000 may be not only a DRAM but also a memory such as an SRAM, ferrodielectric substance memory, or flash memory. Although not shown in the figure, an address bus that supplies the address signal, received from the microprocessor 1001, to the main memory 1000 is provided in addition to the data bus 1003 described above.

In the application shown in FIG. 14, the data alignment circuit 1005 is provided between the main memory 1000 and the data bus 1003. In a system with a bus controller that switches the bus or decides the bus usage right or in a system with a memory management unit that performs physical to logical address conversion or virtual storage control, the bus controller or the memory management unit may have the function of the data alignment circuit 1005 described above.

In addition, as described in the example of the application in FIG. 13, this data alignment circuit 1005 may have the bit rearrangement function and the bit shift function provided by the bit shift circuit 600 described above. In that case, too, the bus controller or the memory management unit may have the function of the data alignment circuit 1005 or the bit shift function described above.

While the invention made by the inventor has been described based on the embodiment, it is to be understood that this invention is not limited to the embodiments described above but many modifications may be made without departing from the spirit of the invention. For example, although a storage device connected to a data processor whose basic data length is 32 bits is described above for convenience, the same effect as that of the above embodiments may be obtained when the present invention is applied to a memory module composed of a semiconductor storage device or a plurality of semiconductor chips connected to a data processor whose basic data size is multiple bits such as 16 bits, 64 bits, 128 bits, 256 bits, 512 bits, 1024 bits, or 2048 bits.

Although data[1*8+k] is allocated next to data[0*8+k] in the embodiment shown in FIG. 1(a), the present invention is not limited only to that allocation. For example, data[2*8+k] may be allocated next to data[0*8+k] and data[3*8+k] may be allocated next to data[0*8+k]. If the bit sequence is the same in different groups, any bit sequence is possible in those groups.

In addition, although group 100_6 is allocated next to group 100_7, group 100_5 is allocated next to group 100_6, and so on in the embodiment in FIG. 1(b), the present invention is not limited only to that sequence. For example, group 100_5 may be allocated next to group 100_7 and group 100_0 may be allocated next to group 100_7.

Although data on the data bus is in a bit array in a common sequence in the application system described above, the bit array of data on the bus may be an array specific to the present invention such as the one shown in FIG. 1(a). In that case, the CPU or the microprocessor may convert the bit array of data or, instead, the system may be configured by scrambling the signal lines on the bus such that data in the CPU is in a common sequence and data in the memory is in a sequence specific to the present invention. Instead, by using a special method for the connection between the CPU data terminals and the bus signal lines or the connection between the memory data terminals and the bus signal lines, the system may be configured such that the CPU outputs the data of the bit array in a common sequence but the data is input to the memory as data in the sequence according to the present invention.

EFFECTS OF THE INVENTION

The typical effects obtained by the invention disclosed in this application will be described briefly below.

That is, the system reads data speedily in units of bytes and, at the same time, significantly reduces the amount of devices and wiring used to build a circuit for executing bit shift operation, making a low-power storage device available. In addition, the reduction in the number of signal lines in the wiring running in parallel for bit shift operation reduces the wiring area, and minimizes the crosstalk, of the device.

What is claimed is:

1. A storage device that comprises a memory cell array comprising a plurality of memory cells; word lines used to select memory cells from said plurality of memory cells in response to an address signal; and bit lines used to read information stored in the selected memory cells, wherein said storage device is connected to an address bus and a data bus, and wherein a bit array of data stored in the memory array is different from a bit array in the data bus;

wherein information pieces transmitted via adjacent bit signal lines on the data bus are stored in the memory cells a predetermined number of bits apart; and wherein, when a basic read unit is n bits, information pieces, whose logical bit positions are **0\*8+k, 1\*8+k, 2\*8+k, 3\*8+k, . . . , m\*8+k** (where k and m are natural numbers, $0 \leq k \leq 7$ and $0 \leq m \leq n/8-1$), are stored in the memory cells close to one another in the memory cell array.

2. The storage device according to claim 1 capable of reading data pieces which are different in a number of significant bits, further comprising bit shift means for shifting the bit positions by the predetermined number of bits when data having a small number of significant bits is read from the memory cell array.

3. The storage device according to claim 1, further comprising sequence converting means for rearranging the bit array of data read from the memory cell array to the bit array of data for transmission to the data bus.

4. The storage device according to claim 1, capable of writing data pieces which are different in the number of significant bits, further comprising bit shift means for shifting the bit positions by the predetermined number of bits when data having a small number of significant bits is stored in the memory cell array.

5. The storage device according to claim 1, further comprising sequence re-converting means for rearranging the bit array of data to be stored in the memory cell array from the bit array of data on the data bus to a predetermined array.

6. A data processing system comprising the storage device according to claim 1, a data processor that makes a data read request to said storage device; an address bus and a data bus that connect said storage device and said data processor; and sequence converting means for rearranging a bit array of data read from the memory cell array to a bit array of data for transmission to the data bus.

7. The data processing system according to claim 6, wherein said storage device is a cache memory used by said data processor.

8. The data processing system according to claim 7, wherein said storage device, data processor, address bus, data bus, and sequence converting means are on one semiconductor substrate.

9. The data processing system according to claim 6, wherein said storage device, data processor, address bus, data bus, and sequence converting means are on one semiconductor substrate.

10. A data processing system comprising the storage device according to claim 1, a data processor that makes a data read request to said storage device; and an address bus and a data bus that connect said storage device and said data processor, wherein said data processor has a function for rearranging a bit array of data read from the memory cell array to a bit array of data for transmission to the data bus.

11. A data processing system comprising the storage device according to claim 1, a data processor that makes a data read request to said storage device; an address bus and a data bus that connect said storage device and said data processor; and a bus controller that decides a bus usage right or a memory management unit that performs conversion between logical addresses and physical addresses, wherein said bus controller or said memory management unit has a function for rearranging a bit array of data read from the memory cell array to a bit array of data for transmission to the data bus.

12. For use in a semiconductor storage device comprising address input terminals; data terminals connected to a data bus; and a memory cell array which comprises a plurality of memory cells; word lines used to select memory cells from said plurality of memory cells in response to an address signal; and bit lines used to read information stored in the selected memory cells, a data storage method for use in a semiconductor storage device for storing information pieces, transmitted via adjacent bit signal lines on the data bus, in the memory cells a predetermined number of bits apart;

wherein, when a basic read unit is n bits, information pieces, whose logical bit positions are **0\*8+k, 1\*8+k, 2\*8+k, 3\*8+k, . . . , m\*8+k** (where k and m are natural numbers, $0 \leq k \leq 7$ and $0 \leq m \leq n/8-1$), are stored in the memory cells close to one another in the memory cell array.

13. A data sequence converting circuit which is connected between data signal terminals of a storage device and a data bus and to which a predetermined control signal is input, said data signal terminals receiving data in response to address information input to address signal terminals of the storage device, said data sequence converting circuit comprising data bus connection terminals which are as many as data bus lines and which are connected to the data bus and data signal connection terminals which are as many as data bus lines and which are connected to the data signal terminals, wherein said data sequence converting circuit either outputs signals input from the data bus connection terminals, which are adjacent to one another, from the data signal connection terminals which are not adjacent and which are at a predetermined interval or outputs signals, which are input from the data signal connection terminals at a predetermined interval, from the data bus connection terminals which are adjacent to one another;

wherein, when a basic read unit is n bits, information pieces, whose logical bit positions are **0\*8+k, 1\*8+k, 2\*8+k, 3\*8+k, . . . , m\*8+k** (where k and m are natural numbers, $0 \leq k \leq 7$ and $0 \leq m \leq n/8-1$), are stored in memory cells close to one another in a memory cell array of the storage device.

14. The data sequence converting circuit according to claim 13, further comprising a shift circuit for use when the storage device reads basically in units of n bits, wherein said shift circuit shifts bit positions of n bits of data, read from the storage device, a predetermined number of bits assuming that the n bits of data read from the storage device is data with smaller number of bits than n bits and outputs the data from the data bus connection terminals.

* * * * *